United States Patent
Donohue

(10) Patent No.: US 7,557,591 B2
(45) Date of Patent: Jul. 7, 2009

(54) SYSTEM AND METHOD FOR DETERMINING THE STATE OF A FILM IN A PLASMA REACTOR USING AN ELECTRICAL PROPERTY

(75) Inventor: John Donohue, Farmington, NM (US)

(73) Assignee: Tokyo Electron Limited, Tokyo (JP)

( * ) Notice: Subject to any disclaimer, the term of this patent is extended or adjusted under 35 U.S.C. 154(b) by 418 days.

(21) Appl. No.: 10/508,009

(22) PCT Filed: Mar. 28, 2003

(86) PCT No.: PCT/US03/08679

§ 371 (c)(1),
(2), (4) Date: Apr. 8, 2005

(87) PCT Pub. No.: WO03/083911

PCT Pub. Date: Oct. 9, 2003

(65) Prior Publication Data

US 2006/0231526 A1    Oct. 19, 2006

Related U.S. Application Data

(60) Provisional application No. 60/367,787, filed on Mar. 28, 2002.

(51) Int. Cl.
G01R 27/08     (2006.01)
G01R 31/08     (2006.01)
(52) U.S. Cl. .................................. 324/716; 324/522
(58) Field of Classification Search ................. 324/716, 324/522
See application file for complete search history.

(56) References Cited

U.S. PATENT DOCUMENTS

| | | | |
|---|---|---|---|
| 4,949,670 A | 8/1990 | Krogh | |
| 5,016,663 A | 5/1991 | Mase et al. | |
| 5,458,732 A | 10/1995 | Butler et al. | |
| 5,467,013 A | 11/1995 | Williams et al. | |
| 5,474,648 A | 12/1995 | Patrick et al. | |
| 5,576,629 A | 11/1996 | Turner et al. | |
| 5,936,413 A * | 8/1999 | Booth et al. | 324/678 |
| 5,971,591 A | 10/1999 | Vona et al. | |
| 6,440,260 B1 | 8/2002 | Denda et al. | |
| 6,466,881 B1 * | 10/2002 | Shih et al. | 702/84 |
| 6,559,060 B2 * | 5/2003 | Hamm et al. | 438/719 |
| 7,341,644 B2 * | 3/2008 | Sakano et al. | 156/345.24 |
| 2001/0025691 A1 * | 10/2001 | Kanno et al. | 156/345 |

FOREIGN PATENT DOCUMENTS

| | | |
|---|---|---|
| JP | 63-244739 | 10/1988 |
| JP | 1-143123 | 10/1989 |
| JP | 7-258853 | 10/1995 |

\* cited by examiner

Primary Examiner—Amy He
(74) Attorney, Agent, or Firm—Oblon, Spivak, McClelland, Maier & Neustadt, P.C.

(57) ABSTRACT

The present invention describes a system and method for monitoring a material film within a plasma processing device. The system includes a plasma reactor formed by a reactor wall and an electrode, a RF generator to couple electrical energy to the electrode, an electrical measurement device for measuring an electrical property of the plasma processing device, and a controller coupled to the electrical measurement device and programmed to determine a state of a film on the reactor wall based on the measured electrical property.

16 Claims, 10 Drawing Sheets

SYSTEM AND METHOD FOR DETERMINING THE STATE OF A FILM IN A PLASMA REACTOR USING AN ELECTRICAL PROPERTY

CROSS-REFERENCE TO RELATED APPLICATIONS

The present application claims the benefit of U.S. Provisional Application No. 60/367,787, filed Mar. 28, 2002. The entire contents of that application are herein incorporated by reference.

BACKGROUND OF THE INVENTION

1. Field of Invention

The present invention relates to plasma processing and more particularly to a film monitoring system in plasma processing.

2. Description of Related Art

The fabrication of integrated circuits (IC) in the semiconductor industry typically employs plasma to create and assist surface chemistry within a plasma reactor necessary to remove material from and deposit material to a substrate. In general, plasma is formed within the plasma reactor under vacuum conditions by heating electrons to energies sufficient to sustain ionizing collisions with a supplied process gas. Moreover, the heated electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to the particular process being performed within the chamber (e.g., etching processes where materials are removed from the substrate or deposition processes where materials are added to the substrate).

The semiconductor industry is constantly striving to produce smaller ICs and to increase the yield of viable ICs. Accordingly, the material processing equipment used to process the ICs have been required to meet increasingly more stringent performance requirements for etching and deposition processes (e.g., rate, selectivity, critical dimension, etc.).

SUMMARY OF THE INVENTION

The present invention provides a film monitoring system for monitoring a wall film forming on a reactor wall within a plasma processing device. The plasma processing device comprises a plasma reactor formed by a reactor wall and an electrode, a RF generator to couple electrical energy to the electrode, an impedance match network to maximize the transfer of electrical energy from the RF generator to the plasma through the electrode, and an electrical measurement device for measuring an electrical property of the plasma processing device.

It is a further object of the present invention to provide a method of monitoring the state of the wall film comprising the steps of energizing the electrode by coupling electrical energy from the RF generator through the impedance match network to the electrode and forming a plasma, measuring an electrical property between the RF generator and the electrode, and determining a state of the film on the reactor wall, wherein the determining includes correlating an electrical property with the state of the wall film.

It is a further object of the present invention to determine a time for scheduling at least one of a cleaning process and a maintenance process for the plasma reactor when the state of the film exceeds a threshold value.

BRIEF DESCRIPTION OF THE DRAWINGS

These and other objects and advantages of the invention will become more apparent and more readily appreciated from the following detailed description of the exemplary embodiments of the invention taken in conjunction with the accompanying drawings, where.

DETAILED DESCRIPTION OF EXEMPLARY EMBODIMENTS

The present invention relates to a method and apparatus for monitoring a film in a plasma processing device. The present invention advantageously provides a method and apparatus that enables device manufacturers to satisfy more stringent performance requirements for plasma processing equipment used in the semiconductor industry.

Figure 1A:
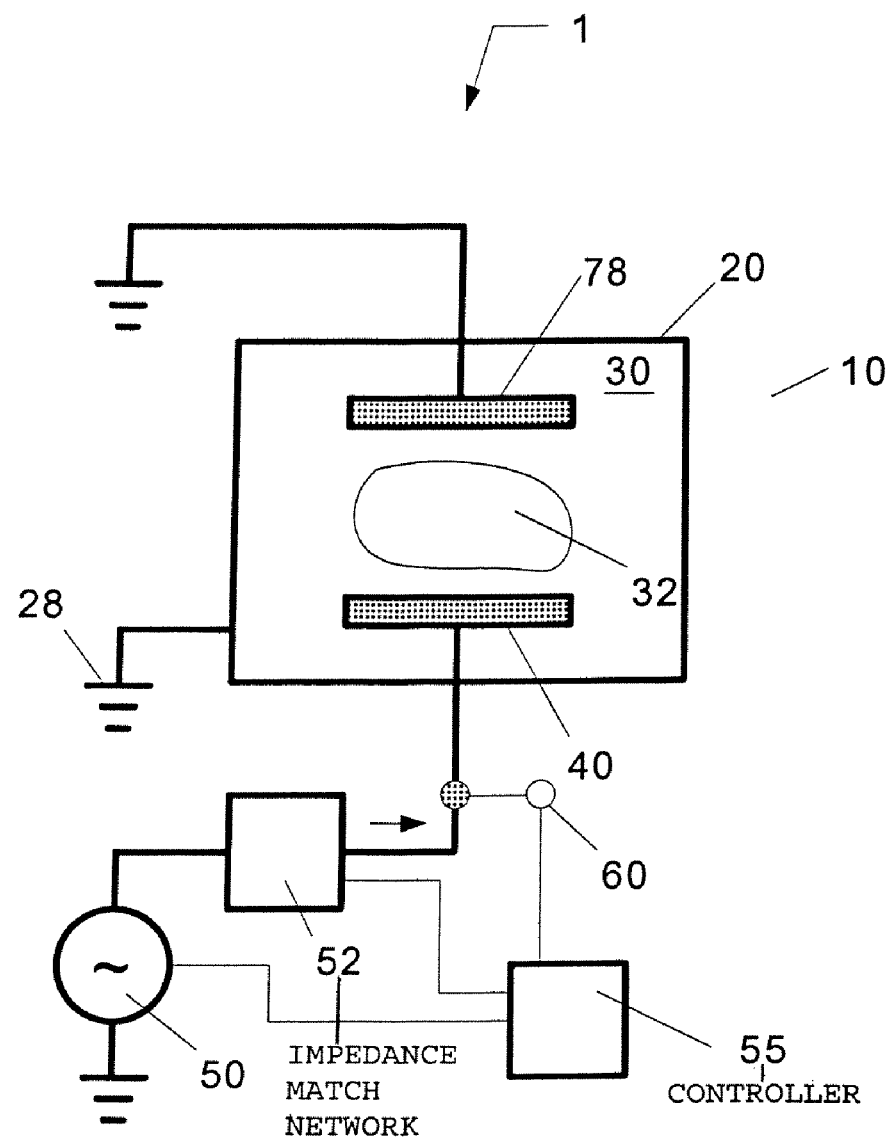
FIG. 1A presents a schematic representation of a plasma reactor according to one embodiment of the present invention.

FIG. 1A presents a schematic cross-section of a plasma processing device 1 comprising a plasma reactor 10, wherein the plasma reactor 10 further comprises a reactor wall 20 to enclose a plasma processing space 30 and at least one electrode (e.g., lower electrode 40) to facilitate the formation of plasma 32 in plasma processing space 30. Plasma processing device 1 further comprises a radio frequency (RF) generator 50 coupled to the lower electrode 40 through an impedance match network 42. RF generator 50 couples electrical energy to the lower electrode 40, hence, enabling the formation of plasma 32 in plasma processing space 30. Impedance match network 52 maximizes the transfer of power from RF generator 50 to plasma 32 through the lower electrode 40 by matching the output impedance of RF generator 50 to the input impedance of the electrical load that includes plasma 32, and, thereby, minimizing the reflection of RF power. The use of RF power and implementation of impedance match networks are well known to those skilled in the art of RF electronics and plasma processing. As illustrated, the device 1 also includes an upper electrode 78 coupled to ground. As would be understood by one of ordinary skill, the RF generator 50 could instead be coupled to the upper electrode 78, with the lower electrode being coupled to ground or another RF or DC generator.

FIG. 1A further comprises an electrical measurement device 60 for measuring an electrical property of plasma processing device 1 between RF generator 50 and the lower electrode 40. Electrical measurement device 60 can measure an electrical property such as, for example, a voltage, a current or an impedance in the RF system utilized for forming plasma 32. Electrical measurement device 60 can be, for example, a voltage-current probe such as that described in detail in pending U.S. application Ser. No. 60/259,862 filed on Jan. 8, 2001, and U.S. Pat. No. 5,467,013 issued to Sematech, Inc. on Nov. 14, 1995; each of which is incorporated herein by reference in its entirety.

In the illustrated embodiment, shown in FIG. 1A, the lower electrode 40 can, as described above, serve as an electrode through which RF power is coupled to plasma in processing region 30. For example, the lower electrode 40 is electrically biased at a RF voltage via the transmission of RF power from RF generator 50 through impedance match network 52 to the lower electrode 40. The RF bias can serve to heat electrons and, thereby, form and maintain plasma. In this configuration, the system can operate as a reactive ion etch (RIE) reactor, wherein the chamber and upper gas injection electrode serve as ground surfaces. A typical frequency for the RF bias can range from 1 MHz to 100 MHz and is preferably 13.56 MHz. RF systems for plasma processing are well known to those skilled in the art.

Alternately, RF power is applied to the lower electrode 40 at multiple frequencies. Furthermore, impedance match network 52 serves to maximize the transfer of RF power to plasma in plasma reactor 10 by minimizing the reflected power. Match network topologies (e.g. L-type, π-type, T-type, etc.) and automatic control methods are well known to those skilled in the art.

Furthermore, a controller 55 comprising a microprocessor, memory, and a digital I/O port capable of generating control voltages sufficient to communicate and activate inputs to plasma processing device 1 as well as monitor outputs from plasma processing device 1. Moreover, controller 55 is coupled to and exchanges information with RF generator 50, impedance match network 52, and electrical measurement device 60. A program stored in the memory is utilized to activate the inputs to the aforementioned components of plasma processing device 1 according to a stored process recipe. One example of controller 55 is a DELL PRECISION WORKSTATION 610™, available from Dell Corporation, Dallas, Tex.

Figure 1B:
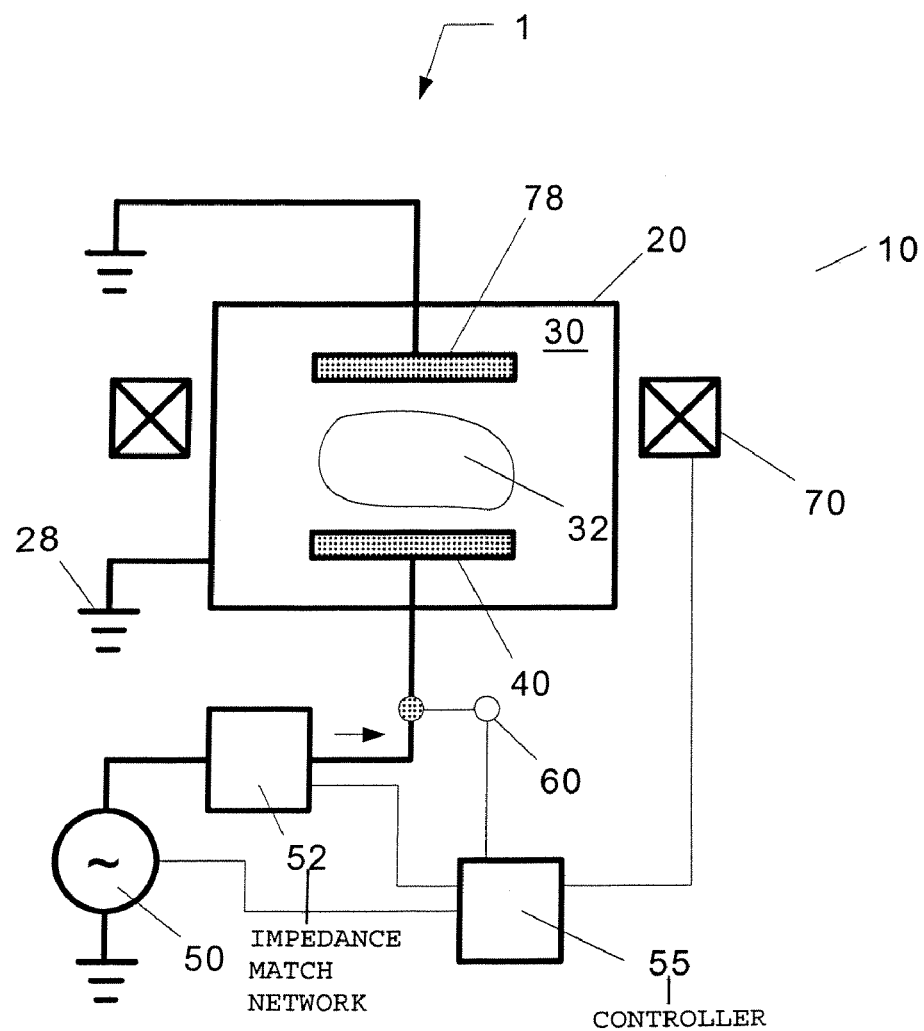
FIG. 1B presents a schematic representation of a plasma reactor according to another embodiment of the present invention.

In the illustrated embodiment, shown in FIG. 1B, the plasma processing device 1 can, for example, further comprise either a mechanically or electrically rotating dc magnetic field system 70, in order to potentially increase plasma density and/or improve plasma processing uniformity, in addition to those components described with reference to FIG. 1A. Moreover, controller 55 is coupled to rotating magnetic field system 70 in order to regulate the speed of rotation and field strength. The design and implementation of a rotating magnetic field is well known to those skilled in the art.

Figure 1C:
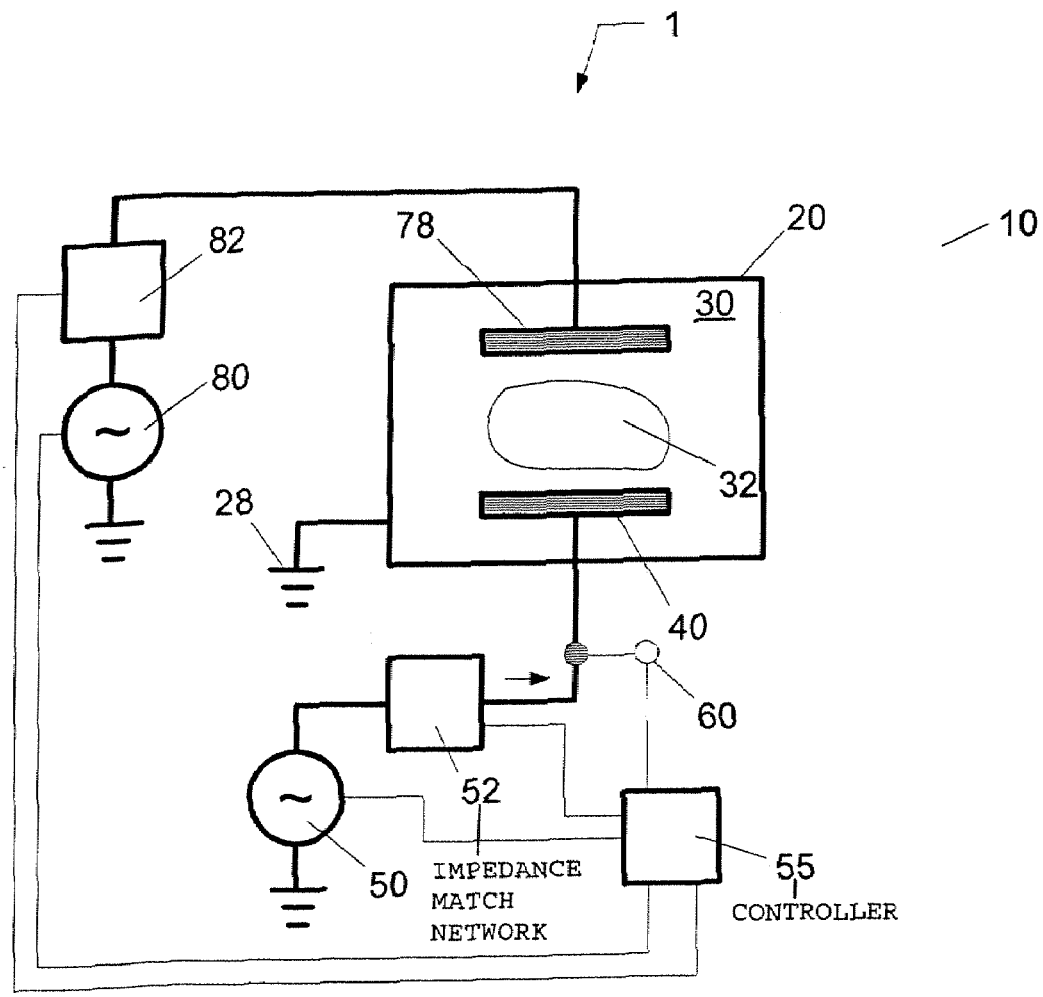
FIG. 1C presents a schematic representation of a plasma reactor according to another embodiment of the present invention.

In the illustrated embodiment, shown in FIG. 1C, the plasma processing device 1 of FIG. 1A can, for example, further comprise an upper electrode 78 to which RF power can be coupled from RF generator 80 through impedance match network 82. A typical frequency for the application of RF power to the upper electrode 78 can range from 10 MHz to 200 MHz and is preferably 60 MHz. Additionally, a typical frequency for the application of power to the lower electrode 40 can range from 0.1 MHz to 30 MHz and is preferably 2 MHz. Moreover, controller 55 is coupled to RF generator 80 and impedance match network 82 in order to control the application of RF power to the upper electrode 78. The design and implementation of an upper electrode is well known to those skilled in the art.

Figure 1D:
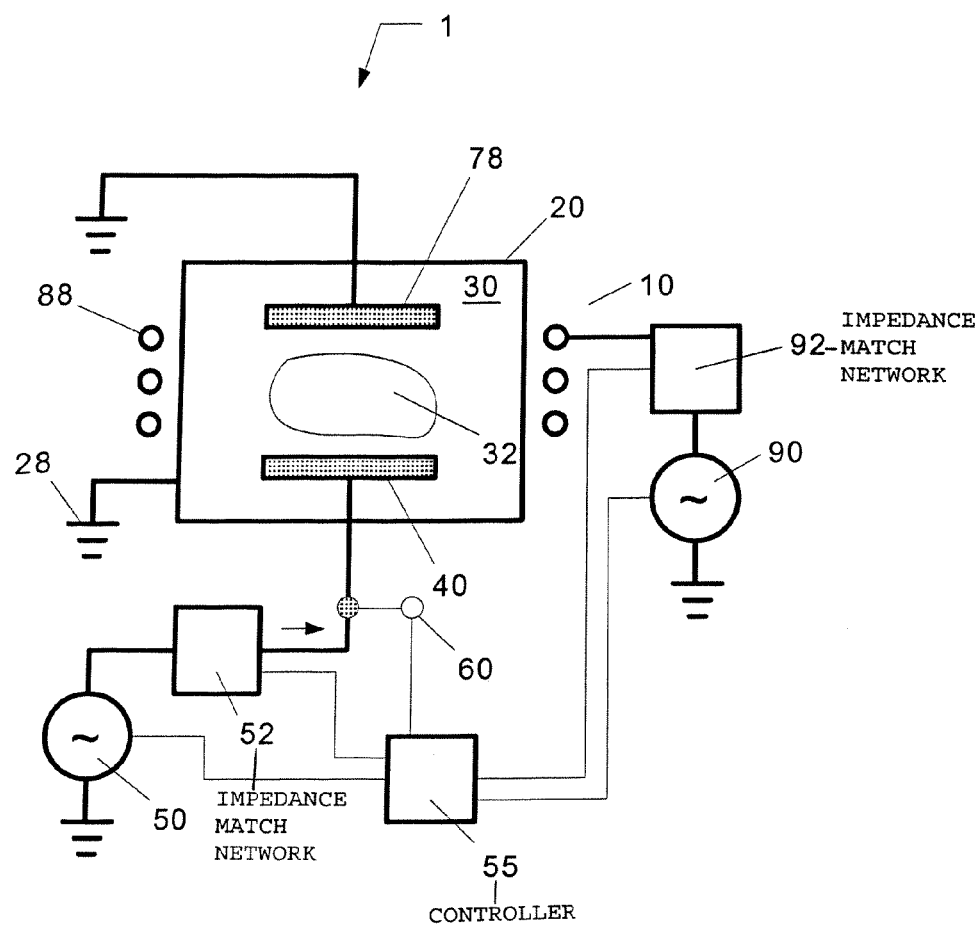
FIG. 1D presents a schematic representation of a plasma reactor according to another embodiment of the present invention.

In the illustrated embodiment, shown in FIG. 1D, the plasma processing device of FIG. 1A can, for example, further comprise an inductive coil 88 to which RF power is coupled via RF generator 90 through impedance match network 92. RF power is inductively coupled from inductive coil 88 through dielectric window (not shown) to plasma processing region 30. A typical frequency for the application of RF power to the inductive coil 88 can range from 10 MHz to 100 MHz and is preferably 13.56 MHz. Similarly, a typical frequency for the application of power to the lower electrode 40 can range from 0.1 MHz to 30 MHz and is preferably 13.56 MHz. In addition, a slotted Faraday shield (not shown) can be employed to reduce capacitive coupling between the inductive coil 88 and plasma. Moreover, a controller (not shown) is coupled to RF generator 90 and impedance match network 92 in order to control the application of power to inductive coil 88. The design and implementation of an inductively coupled plasma (ICP) source is well known to those skilled in the art.

Alternately, the plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

In an electrical circuit, the addition of a new circuit element can change or shift the circuit's electrical properties, as observed by an electrical measurement device. For example, a plasma reactor that employs RF power to facilitate the formation of a processing plasma comprises a complete electrical circuit. If an internal element of this circuit varies, a shift in the electrical parameters of the plasma reactor circuit can be detected.

Referring again to FIG. 1A, RF generator 50 supplies RF power to the plasma reactor through an impedance match network 52 and the power is returned back to the generator ground 28 through the grounded surfaces in plasma reactor 20. As described above, electrical measurement device 60 can monitor basic electrical parameters that govern the characteristics of the plasma such as, for example, the reactor current $I_c$ and reactor voltage $V_c$.

Figure 2:
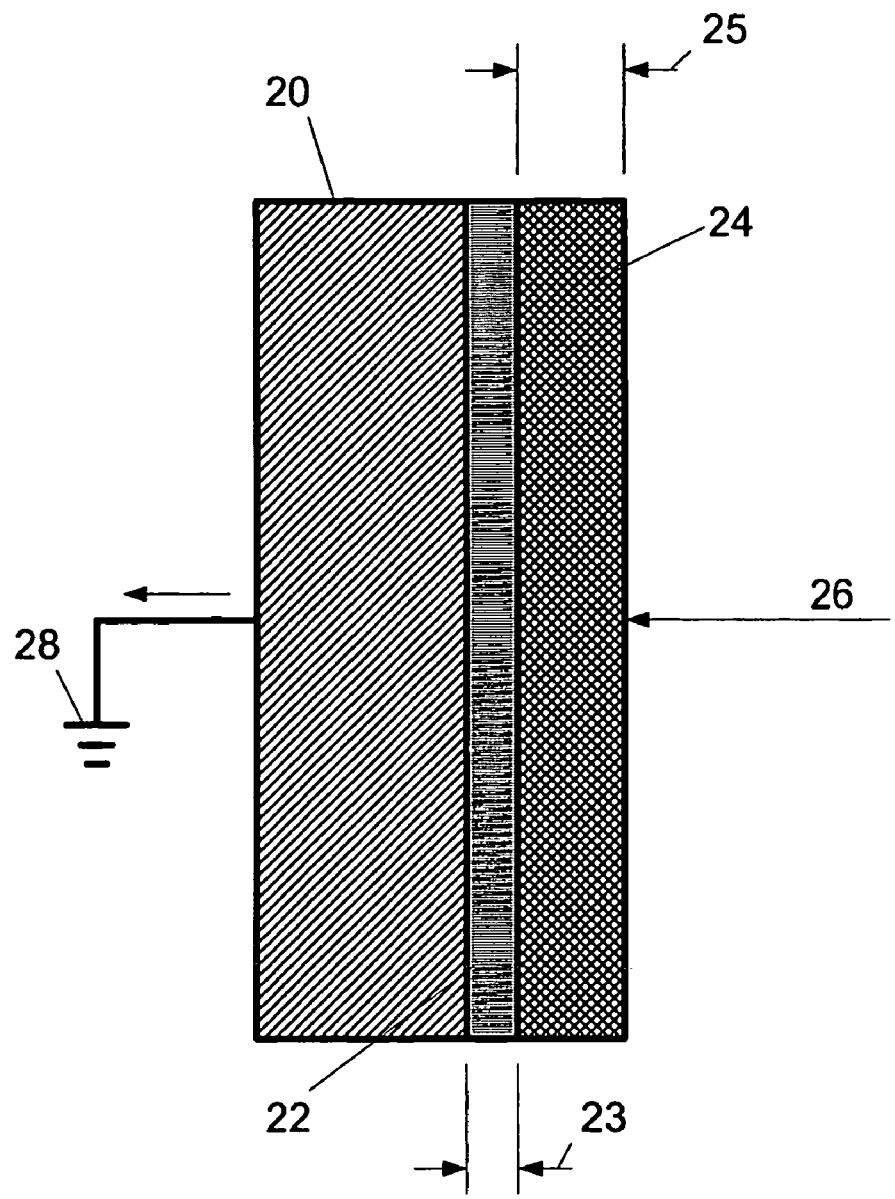
FIG. 2 presents a schematic cross-section of a surface of the reactor wall forming the plasma reactor depicted in FIGS. 1A-D.

FIG. 2 shows an exploded view of a section of reactor wall 20. Reactor wall 20 can, for example, comprise aluminum with an anodized aluminum layer 22, as shown in FIG. 2. Furthermore, FIG. 2 depicts an anodized aluminum layer 22 of thickness 23 overlaid with a wall film 24 of thickness 25. The wall film thickness 25 changes with subsequent processing. It can increase or decrease depending upon the chemistry and process parameters utilized. Wall film 24 can comprise, for example, a C—F polymer when etching silicon dioxide ($SiO_2$) using fluorocarbon chemistries, and the film thickness 25 can be as great as hundreds of microns thick. The thickness 23 of the anodized aluminum layer 22 is generally 10 to 50 microns.

Note that the reactor current $I_c$, denoted by numeral 26 in FIG. 2, must pass through the wall film 24 and the anodization layer 22 to reach reactor wall 20 that is coupled to ground 28. In general, the reactor current 26 will decrease as the wall film thickness increases. Since power delivered to the plasma reactor is monitored and maintained constant during any particular step in a process, a decrease in reactor current 26 can also be accompanied by an increase in the reactor voltage $V_c$ in order to maintain a constant power input.

The total apparent power $S_{del}$ delivered to the chamber (real and reactive) is given by:

$$S_{del} = |\tilde{V}_c| \cdot |\tilde{I}_c| \tag{1}$$

where $$\tilde{V}_c = V_{cm} e^{i\omega t} \text{ and } \tilde{I}_c = I_{cm} e^{i(\omega t + \theta)}.$$

$V_c$ and $I_c$ represent AC signals shifted in phase by phase angle $\theta$. The value of $\theta$ can depend upon the process recipe and the design of the plasma reactor. This total power $S_{del}$ is energy delivered to the resistive and reactive components of the plasma reactor. It is obvious from equation (1), that if the delivered apparent power $S_{del}$ were maintained constant, $V_c$ and $I_c$ would have inverse relations to each other. For practical purposes, the active delivered power is calculated in terms of measurable variables, viz.:

$$P_{del} = V_{cm} I_{cm} \cos(\theta) \tag{2}$$

Using root mean square (rms) values for the voltage and current, equation (2) becomes:

$$P_{del} = \frac{V_c}{\sqrt{2}} \cdot \frac{I_c}{\sqrt{2}} \cos(\theta) = \frac{1}{2} \cdot V_c I_c \cos(\theta). \tag{3}$$

Figure 3:
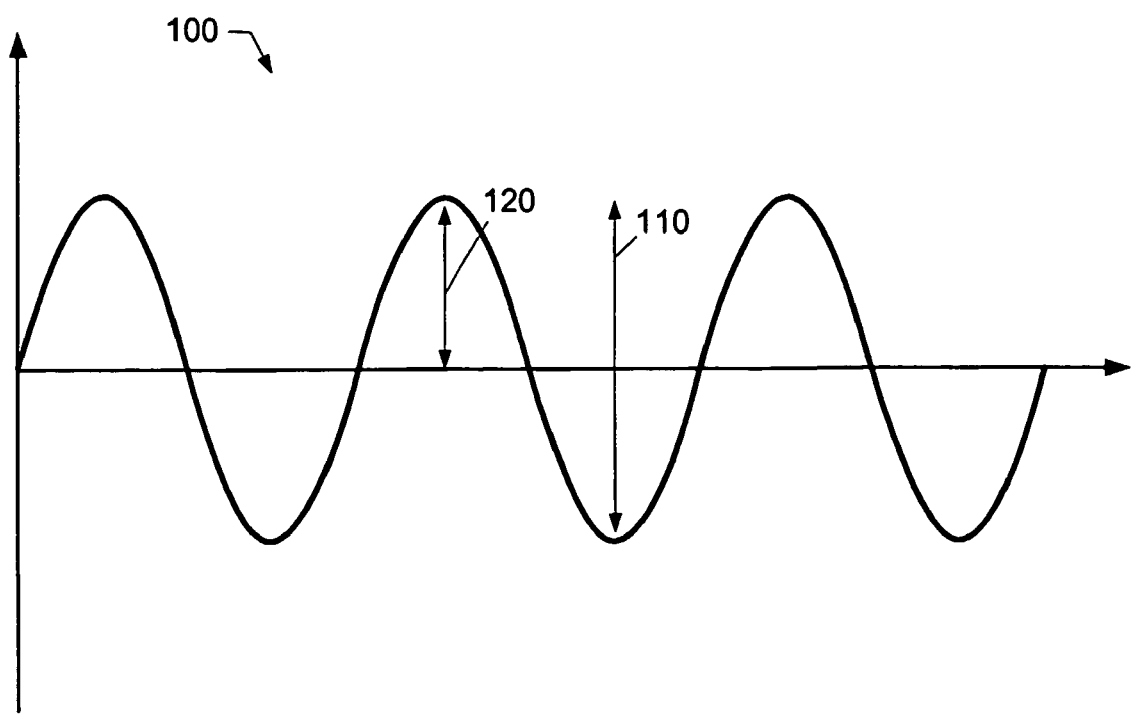
FIG. 3 presents a schematic illustration of a measured RF waveform.

In FIG. 3, a RF waveform is depicted, wherein other useful electrical properties are shown to include the peak-to-peak voltage $V_{pp}$ 110 of the RF signal and the peak voltage $V_p$ 120 (which is generally half of $V_{pp}$).

The peak-to-peak voltage $V_{pp}$ 110 can be related to the voltage or magnitude of $V_{cm}$ as follows:

$$V_{cm} = V_p = \frac{V_{pp}}{2}. \tag{4}$$

Substituting equation (4) into equation (3), an expression for delivered power as a function of $V_{pp}$ is determined, viz.:

$$P_{del} = \frac{1}{4} V_{pp} I_c \cos(\theta). \tag{5}$$

The delivered power $P_{del}$ is approximately equal to the generator power, providing the reflected power and losses through the matching network are minimal. Knowing this, it follows that the real current delivered to the plasma reactor becomes:

$$I_{real} = I_c \cos(\theta) = \frac{4 P_{del}}{V_{pp}}. \tag{6}$$

Referring again to FIG. 2, the wall film 24 has an associated capacitance as does the anodization layer 22. The wall film thickness $d_p$ (25) as well as the dielectric constant $\varepsilon_p$ can change during a process and from wafer-to-wafer. The anodization thickness $d_a$ (23) and dielectric constant $\varepsilon_a$ can remain constant unless the anodization layer 22 is degraded by contact with plasma 32.

Generally, the anodization capacitance is in series with the wall film capacitance, hence, the total capacitance is given by:

$$C_{combined} = \frac{A_p A_a \varepsilon_p \varepsilon_a}{A_a \varepsilon_a d_p + A_p \varepsilon_p d_a}, \tag{7a}$$

where $A_p$ and $A_a$ are the surface areas of the respective capacitor "plates" (i.e. surface area of anodization $A_a$ and surface area of film coating $A_p$). Equation (7a) can be simplified if the following condition is satisfied:

$$d_p \geq 10 \, d_a. \tag{7b}$$

This condition implies that once the wall film thickness 25 becomes greater than or equal to 10 times the anodization thickness 23, then the dominating capacitance in this series combination is the wall film capacitance. Of course, the dielectric constant plays an important role as well. The dielectric constant for anodized aluminum can vary from a value of 7.0 to 9.5, and the dielectric constant for C—F ("Teflon") polymers can vary from a value of 2.1 to 2.5.

Clearly, the anodized aluminum has the greater dielectric constant in comparison to C—F polymers. Consequently, the combination of a greater thickness and lower dielectric constant for the wall film 24, imply that, in general, it is the dominating capacitance in the series combination described above.

Using the simplification described in the context of equation (7) allows the total capacitance at the reactor wall 20 to be determined by:

$$C_{combined} = C_p = \frac{A_p \varepsilon_p}{d_p}. \tag{8}$$

Figure 4:
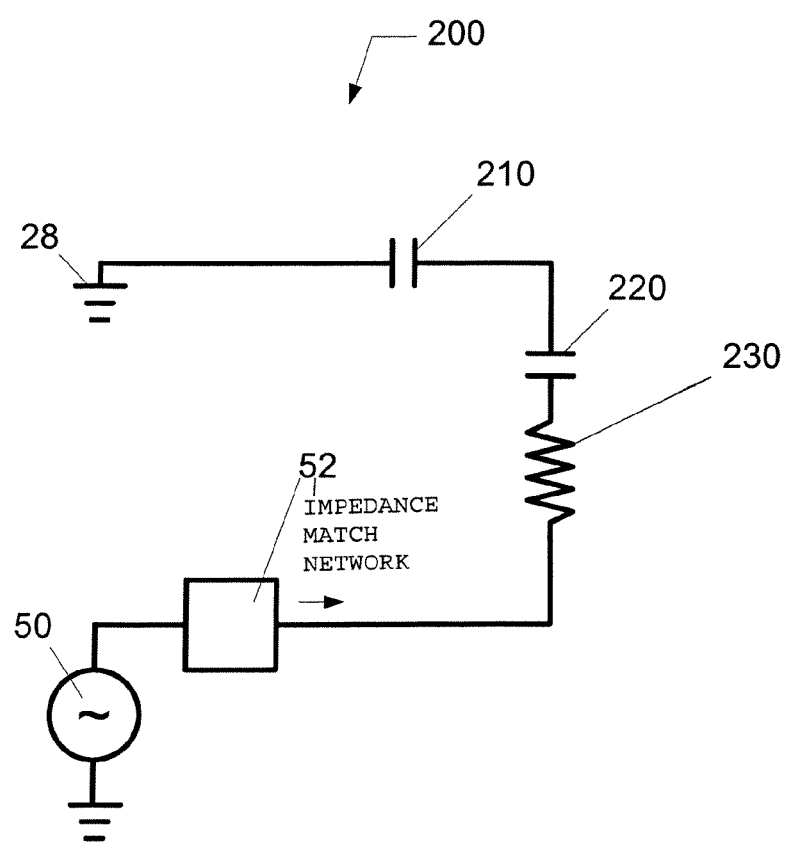
FIG. 4 presents a schematic diagram of an electrical circuit representative of the plasma reactor depicted in FIGS. 1A-D and 2.

FIG. 4 provides a schematic diagram of an electrical circuit 200 representative of the plasma processing device 1 described in FIGS. 1A-D that incorporates the electrical elements described with reference to FIG. 2 and above. The model accounts for the total reactance of the plasma processing device X' (system capacitance; denoted as numeral 210 in FIG. 4), and the film reactance $X_p$ (denoted as numeral 220 in FIG. 4), as well as the real resistance R (denoted as numeral 230 in FIG. 4) of plasma 32. The system reactance X' includes sheath capacitance, electrostatic chuck capacitance, focus ring capacitance, stray capacitance, etc.

The overall impedance $Z_c$ of the plasma reactor described by the electrical circuit of FIG. 4 can be expressed as:

$$Z_c = R + j(X_p + X') \tag{9}$$

where the magnitude of the chamber impedance is:

$$|Z_c| = \sqrt{R^2 + (X_p + X')^2}. \tag{10}$$

From equation (10), the magnitude of the plasma reactor impedance can increase as the reactance of the wall film $X_p$ increases. Moreover, the magnitude of the plasma reactor impedance is related to the measurable plasma reactor current and voltage, viz.:

$$|Z_c| = \frac{|V_c|}{|I_c|} \quad (11)$$

Substituting equation (4) and equation (6) into equation (11) yields:

$$|Z_c| = \frac{V_{pp}^2}{8P_{del}}\cos(\theta), \quad (12)$$

and rearranging equation (12) gives:

$$V_{pp} = \sqrt{\frac{8P_{del}|Z_c|}{\cos(\theta)}}. \quad (13)$$

Equation 13 clearly shows that the peak-to-peak voltage increases as the magnitude of the plasma reactor impedance increases and, as shown in equation (10), $Z_c$ increases as the wall film reactance $X_p$ increases. Moreover, $X_p$ increases as the film thickness 25 on the reactor wall 20 increases through deposition. Furthermore, using equation (6), an increase in the peak-to-peak voltage is consistent with a decrease in the plasma reactor current when the delivered power is maintained constant. Therefore, the plasma reactor current decreases with increasing wall film reactance or increasing wall film thickness.

Figure 5:
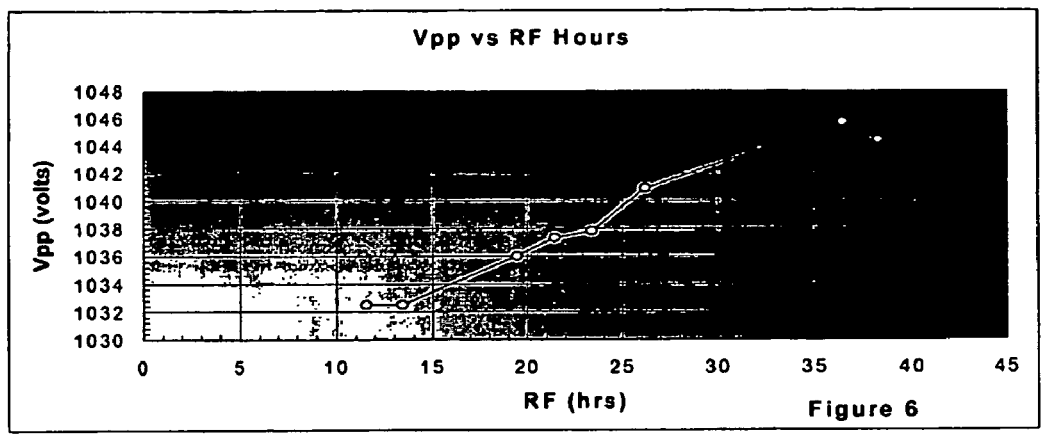
FIG. 5 presents a typical variation of a peak-to-peak voltage measured in the plasma reactor depicted in FIGS. 1A-D as a function of RF hours of operation.
Figure 6:
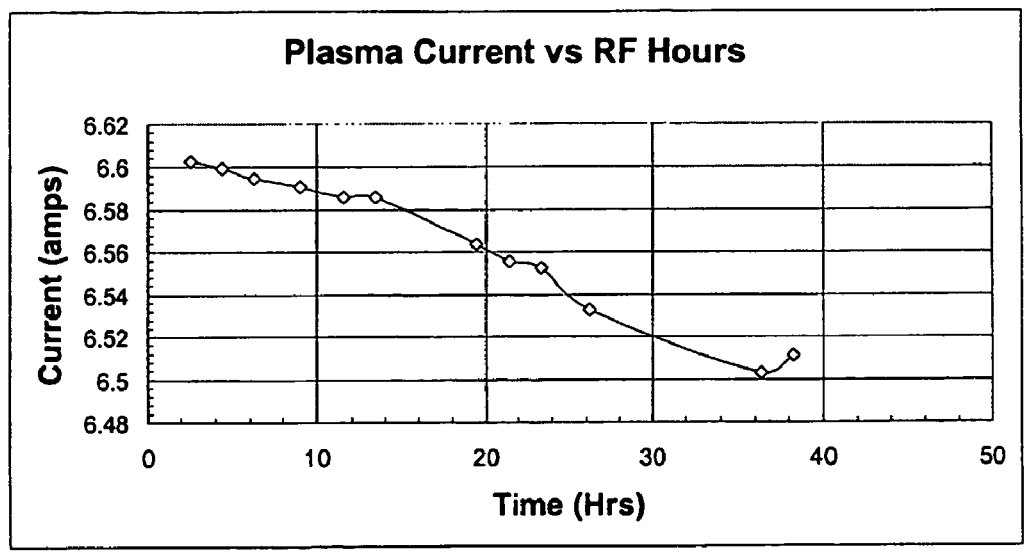
FIG. 6 presents a typical variation of a current measured in the plasma reactor depicted in FIG. 1A as a function of RF hours of operation.

For example, FIG. 5 presents the peak-to-peak voltage as a function of RF hours on a plasma reactor similar to that described in FIGS. 1A-1D. According to equation (13), the peak-to-peak voltage increases as the impedance increases due to more wall film deposition on the plasma reactor wall. Note that the film growth is not constant owing to different processes being executed in the plasma reactor. Some processes remove wall film thickness from the plasma reactor walls, whereas some processes add wall film thickness. Moreover, FIG. 6 presents the plasma reactor current as a function of time (RF hours). Clearly, as follows from equation (6), the current decreases as the wall film thickness increases.

In addition to coupling RF power from RF generator 50 to plasma 32, the lower electrode 40 can further serve to support a substrate (not shown). Plasma 32 can be utilized to process the substrate atop the lower electrode 40. Alternately, the substrate can be, for example, affixed to the lower electrode 40 via an electrostatic clamp. An electrostatic clamp generally comprises a clamp electrode (not shown) connected to a high voltage (HV), direct current (dc) voltage source (not shown). Typically, the clamp electrode is fabricated from copper and embedded within a ceramic element. The electrostatic clamp can be operable in either a monopolar or bipolar mode; each mode is well known to those skilled in the art of electrostatic clamping systems.

Alternately, the lower electrode 40 can further include a cooling/heating system including a re-circulating fluid that receives heat from the substrate and transfers heat to a heat exchanger system (not shown) when cooling, or when heating, transfers heat from the heat exchanger system to the above elements. In other embodiments, heating elements, such as resistive heating elements, or thermoelectric heaters/coolers can be included as part of the heating/cooling system.

Figure 7:
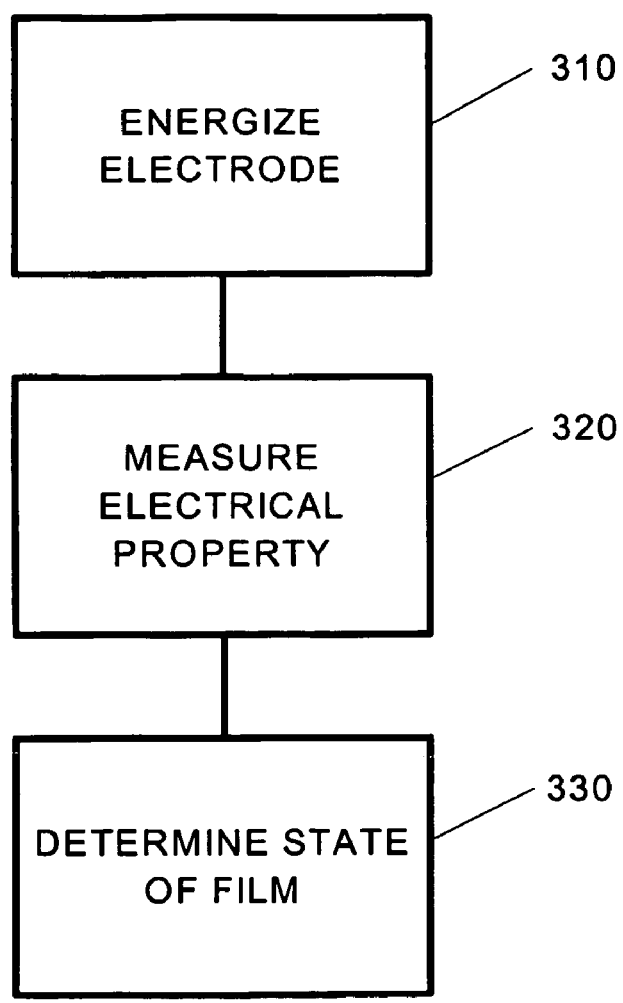
FIG. 7 presents a method of monitoring a film according to a first embodiment of the present invention.

Moreover, heat transfer gas can be delivered to the backside of the substrate. The supply of heat transfer gas can improve the gas-gap thermal conductance between the substrate and the lower electrode 40. The heat transfer gas can be, for example, at least one of a Noble gas such as helium, argon, neon, xenon, krypton, a process gas such as $C_4F_8$, $CF_4$, $C_5F_8$, and $C_2F_6$, or a mixture thereof FIG. 7 is a flowchart 300 of a method of monitoring a wall film in a plasma reactor according to an embodiment of the present invention. The flow chart begins with step 310 wherein electrical energy from RF generator 50 (FIGS. 1A-1D) is coupled to the lower electrode 40 to energize the lower electrode 40. The power coupled to the lower electrode 40 can be sufficient or insufficient to form plasma 32 in plasma processing space 30. In step 320, an electrical property such as, for example, a voltage, a current or an impedance is measured between RF generator 50 and the lower electrode 40. For instance, a RF voltage waveform can be recorded using a voltage-current probe, and a peak-to-peak voltage can be determined. The electrical measurement of step 320 can be performed with or without plasma. In step 330, the state of the wall film forming on the reactor wall 20 of plasma reactor 10 can be determined. For example, the state of the wall film can include a mean film thickness, wherein the mean film thickness is determined via a model described by equations (8), (10) and (13), and measurements of the peak-to-peak voltage, the phase angle θ between the RF voltage and RF current and the delivered RF power. Alternately, the mean film thickness is determined via a calibration of the plasma reactor, wherein the film thickness is related directly to an electrical property such as, for example, a voltage, a current or an impedance. Alternately, the mean film thickness can be determined from the wall film reactance, wherein the wall film reactance is determined via subtracting the system impedance measured with a plasma having a "clean" reactor wall from the system impedance measured with plasma once a wall film has formed on the reactor wall. The system impedance can be measured using an electrical measurement device 60 such as a voltage-current probe wherein the RF voltage and RF current is measured and an impedance is determined from the complex form of equation (11).

Figure 8:
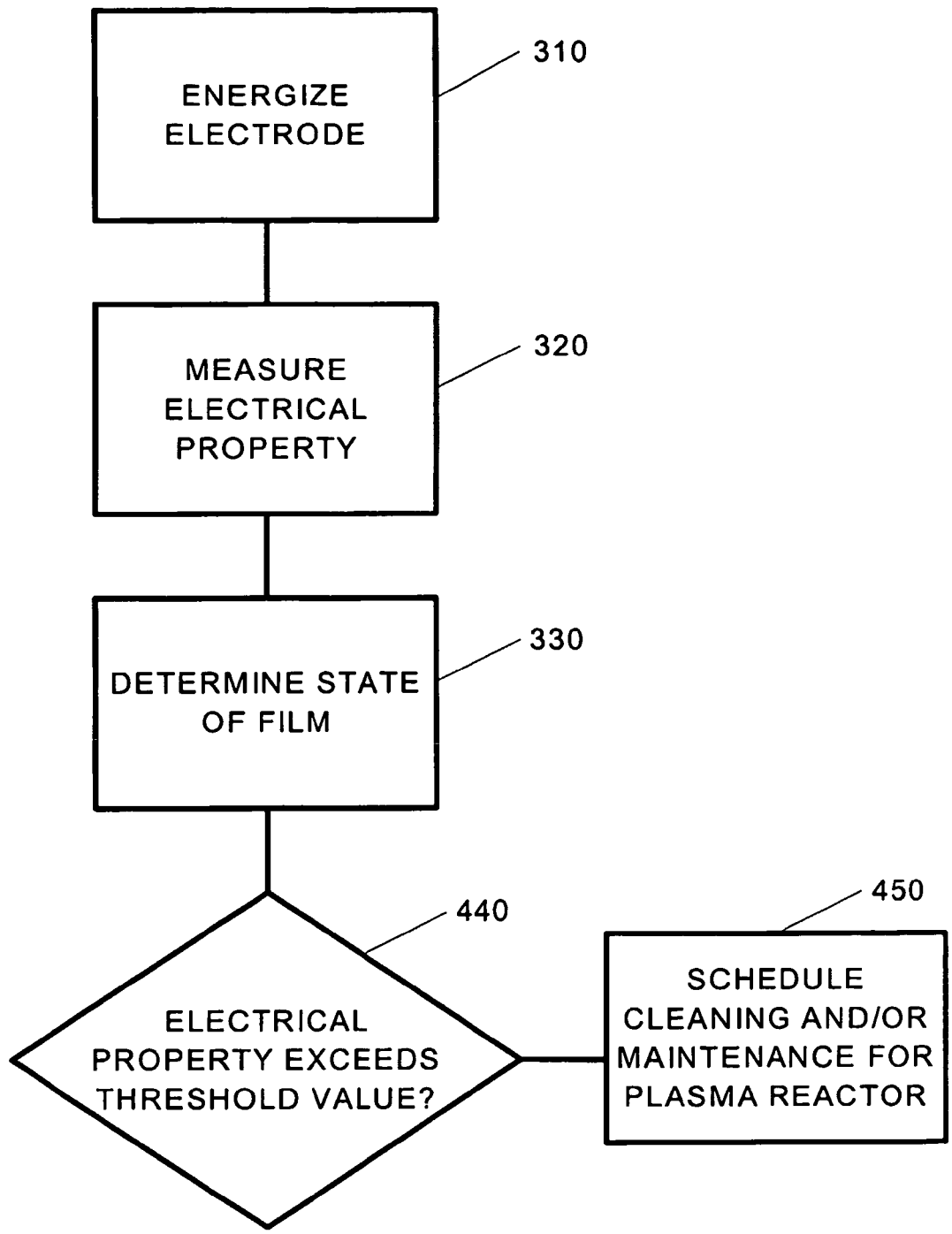
FIG. 8 presents a method of monitoring a film according to a second embodiment of the present invention.

FIG. 8 is a flowchart of a method 400 of monitoring a wall film in a plasma reactor and determining a time to schedule the plasma reactor for cleaning or other maintenance (such as process kit replacement) according to a second embodiment of the present invention. The flow chart comprises similar steps as described in FIG. 7 except that additional steps are added. In step 440, a time to schedule a cleaning process or a maintenance process, such as replacing the process kit, is determined based on at least one of the following: (1) a comparison of a voltage magnitude to a threshold value, (2) a comparison of a current magnitude to a threshold value, (3) a comparison of an impedance magnitude to a threshold value, (4) a comparison of a change in a voltage magnitude to a threshold value, (5) a comparison of a change in a current magnitude to a threshold value, or (6) a comparison of a change in an impedance magnitude to a threshold value. For example, in step 450, when the peak-to-peak voltage measured in a reactor as described in FIG. 5 exceeds a threshold voltage such as, for example, 1100 V, an operator is notified and the plasma reactor is scheduled for cleaning and/or maintenance.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A film monitoring system for a plasma processing device, the system comprising:
 a reactor, said reactor comprises a reactor wall and an electrode configured to cause a formation of plasma in the reactor;
 a RF generator coupled to said electrode, said RF generator configured to couple electrical energy to said electrode;
 an electrical measurement device configured to measure electrical properties between said RF generator and said electrode; and
 a controller coupled to said electrical measurement device, said controller programmed to determine a thickness of a film on said reactor wall based on the measured electrical properties, said electrical properties including an RF voltage and an RF current, and said controller determines the thickness of the film on the reactor wall based at least partially on a peak-to-peak voltage determined from the RF voltage, a phase angle between the RF voltage and the RF current, and a delivered RF power.

2. The film monitoring system according to claim 1, wherein said reactor wall is electrically grounded.

3. The film monitoring system according to claim 1, wherein said reactor wall comprises an anodization layer, and the film on the reactor wall has a thickness greater than the anodization layer such that the film on the reactor wall has a dominant capacitance of the reactor wall.

4. The film monitoring system according to claim 1, wherein said film on said reactor wall comprises C—F polymer.

5. The film monitoring system according to claim 1, wherein said film on said reactor wall forms during a plasma process.

6. The film monitoring system according to claim 1, wherein said controller is programmed to correlate a voltage measured by said electrical measurement device with a thickness of said film on said reactor wall.

7. The film monitoring system according to claim 6, wherein said voltage increases as said thickness of said film increases, and said voltage decreases as said thickness of said film decreases.

8. The film monitoring system according to claim 1, wherein said controller is programmed to correlate a current measured by said electrical measurement device with a thickness of said film on said reactor wall.

9. The film monitoring system according to claim 8, wherein said current increases as said thickness of said film decreases, and said current decreases as said thickness of said film increases.

10. The film monitoring system according to claim 1, wherein said electrical measurement device is a voltage-current probe.

11. The film monitoring system according to claim 1, wherein said electrical energy coupled to said electrode is sufficient to form plasma.

12. The film monitoring system according to claim 1, further comprising an impedance match network for maximizing the coupling of said electrical energy to said electrode.

13. A method of monitoring a film in a plasma reactor, said plasma reactor comprises a reactor wall, an electrode configured to cause a formation of plasma in the reactor, a RF generator coupled to said electrode, said RF generator configured to couple electrical energy to said electrode, and an impedance match network for maximizing the coupling of said electrical energy to said electrode, the method comprising the steps of:
 energizing said electrode by coupling electrical energy from said RF generator through said impedance match network to said electrode;
 measuring electrical properties between said RF generator and said electrode; and
 determining a thickness of said film on said reactor wall based on the measured electrical properties, said electrical properties including an RF voltage and an RF current, and said determining includes determining the thickness of the film on the reactor wall based at least partially on a peak-to-peak voltage determined from the RF voltage, a phase angle between the RF voltage and the RF current, and a delivered RF power.

14. The method according to claim 13, said method further comprising the step of scheduling at least one of a cleaning process and a maintenance process for said plasma reactor when said thickness of said film on said reactor wall exceeds a threshold value.

15. A method of monitoring a film by detecting a change electrical properties of a RF circuit, said RF circuit comprises a RF generator coupled to an impedance match network, said impedance match network coupled to an electrode configured to cause a formation of plasma in the reactor, said electrode coupled to a reactor wall through a plasma processing space, and said reactor wall having said film formed thereon and coupled to ground, the method comprising the steps of:
 energizing said RF circuit by coupling electrical energy from said RF generator through said impedance match network to said electrode;
 measuring said electrical properties of said RF circuit between said RF generator and said electrode; and
 determining a thickness of said film on said reactor wall based on the measured electrical properties, said electrical properties including an RF voltage and an RF current, and said determining includes determining the thickness of the film on the reactor wall based at least partially on a peak-to-peak voltage determined from the RF voltage, a phase angle between the RF voltage and the RF current, and a delivered RF power.

16. The method according to claim 15, wherein said plasma processing space further includes plasma.

* * * * *